United States Patent
Park et al.

(10) Patent No.: US 6,559,714 B2
(45) Date of Patent: May 6, 2003

(54) SIGNAL FILTER WITH ADJUSTABLE ANALOG IMPEDANCE SELECTED BY DIGITAL CONTROL

(75) Inventors: Edwin Park, La Jolla, CA (US); John G. McDonough, La Jolla, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/820,050

(22) Filed: Mar. 28, 2001

(65) Prior Publication Data

US 2002/0140523 A1 Oct. 3, 2002

(51) Int. Cl.$^7$ .................................. H03K 5/00
(52) U.S. Cl. ........................ 327/553; 327/552
(58) Field of Search ................ 327/552, 553, 327/554, 558

(56) References Cited

U.S. PATENT DOCUMENTS 4,105,322 A * 8/1978 Inoue et al. ................ 355/4
5,416,438 A * 5/1995 Shibata ..................... 327/552
5,912,703 A * 6/1999 Tamayama ................. 348/241
6,366,161 B1 * 4/2002 Koazechi ................... 327/553

* cited by examiner

*Primary Examiner*—Dinh T. Le
(74) *Attorney, Agent, or Firm*—Pedro P. Hernandez; W. James Brady, III; Frederick J. Telecky, Jr.

(57) ABSTRACT

A signal filter employs digital control signals to selectively establish and adjust analog impedance components of the filter. In the case of a first-order R-C filter, adjustable resistance and reactance assemblies are coupled in series. The resistance assembly has multiple parallel signal paths sharing a common input and output. Each signal path includes a prescribed electrical resistance and a digital switch to selectively enable and disable the resistance. Between the common input and output, the signal paths provide a collective resistance which varies depending upon which switches have been activated. The reactance assembly is similar to the resistance assembly, with capacitors or inductors instead of resistors. A digital controller selectively activates the switches to adjust the assemblies' respective resistance and reactance.

19 Claims, 6 Drawing Sheets

SIGNAL FILTER WITH ADJUSTABLE ANALOG IMPEDANCE SELECTED BY DIGITAL CONTROL

BACKGROUND OF THE INVENTION

1. Field of the Invention

The present invention relates to analog signal filters. More particularly, the invention concerns a signal filter providing an analog impedance whose value is selectively established by digital control signals and may be changed over time in response to feedback, timing, or other desired input.

2. Description of the Related Art

Analog filters are used in a variety of applications, such as reducing noise, dampening output signals, reducing ringing, decreasing signals of selected frequencies, amplifying selected frequencies, and converting digital signals to analog.

Analog filters include discrete circuit components such as resistors, capacitors, inductors, and the like. Active filters additionally include amplifiers such as transistors, operational amplifiers, differential amplifiers, and the like. One of the most basic analog filters is the so-called "R-C" filter, in which a resistor and capacitor are coupled in series, and one or the other is coupled to electrical ground. The R-C filter's electrical output, taken between the resistor and capacitor, varies depending upon the values chosen for the resistor (R) and the capacitor (C). For instance, if the filter is constructed with a greater R-C product, the filter tends to have a smaller bandwidth and less responsively follow its input signal.

Designers of analog filters, such as R-C filters, seek to minimize signal acquisition time, tracking errors, and power consumption. When a given signal is input to an analog filter, the filter begins to change its output to reach a given steady-state or "target" output, the ultimate characteristics of which depend upon the values and interconnections of the filter's circuit components. Signal acquisition time refers to the time in which the filter generates the target output signal within some tolerance. Thus, signal acquisition time concerns the filter's ability to provide an output signal that quickly responds when its input signal changes or when such a filter is initially presented with an input signal. Tracking error refers to the ongoing error between the filter's actual output signal and the target output signal. Thus, tracking error concerns the filter's ability, after initially responding to an input signal change, to provide an output signal that accurately tracks the target output signal. Bandwidth concerns the signal filter's operable range of input signal frequencies.

Unfortunately, the interests of maximum bandwidth with minimal signal acquisition time, minimal tracking error, and low power consumption tend to oppose each other. Broader bandwidth is compatible with faster signal acquisition, but comes with the cost of poor signal tracking when the input signal is noisy and also at the expense of higher power consumption. Conversely, accurate signal tracking means poorer signal acquisition and narrower bandwidth. Therefore, designers often sacrifice one or more less important filter attributes in favor of other, more important ones. Depending upon the particular application in which a signal filter is utilized, these sacrifices can have tangible effects. In a household thermostat, for example, longer acquisition times in a room thermostat mean longer wait times until a desired room temperature is achieved. In that same household thermostat, a poor tracking error may result in room temperature that varies by five or ten degrees from the desired room temperature.

As mentioned above, circuit designers are unable to satisfy the competing goals of maximum bandwidth, minimal signal acquisition time, minimal tracking error, and low power consumption. This forces circuit designers to design filters that necessarily sacrifice one or more of these properties. Known analog signal filters, then, are not completely adequate in all respects due to certain unsolved problems.

SUMMARY OF THE INVENTION

Broadly, the present invention concerns a signal filter providing an analog impedance whose value is established by digital control signals and may be changed over time in response to feedback signals, timing signals, or other desired input. In one embodiment, the signal filter is implemented to provide a first-order R-C filter and includes a resistance assembly and a reactance assembly. The resistance assembly has multiple parallel signal paths sharing a common input and a common output. Each signal path exhibits a prescribed electrical resistance, such as a resistor or inherent line resistance, and includes a switch to selectively disable or enable the resistance. Between the common input and output, the signal paths provide a collective resistance which varies depending upon which switches have been activated.

The reactance assembly includes at least one reactance element, such as a capacitor or inductor, coupled between the resistance assembly's common output and electrical ground. If adjustable reactance is desired, the reactance assembly may be constructed to include multiple parallel signal paths coupled between the output and electrical ground, where each signal path in the reactance assembly includes an electrical reactance and with a switch to selectively disable or enable the reactance. Thus, the signal paths of the reactance assembly provide a collective reactance between the output and electrical ground.

A digital controller is coupled to the switches. The controller is programmed, constructed, configured, or otherwise built to adjust the resistance assembly's collective resistance (and reactance assembly's collective reactance, if applicable) by selectively activating the switches. The controller circuit may act in response to a feedback signal (such as the signal at the common output), a clock signal, a custom logic signal, or any other desired signal.

The foregoing features may be implemented in a number of different forms. For example, the invention may be implemented to provide a method of signal filtering utilizing adjustable filter parameters. In another embodiment, the invention may be implemented to provide an apparatus such as a configurable signal filter. In still another embodiment, the invention may be implemented to provide a signal-bearing medium tangibly embodying a program of machine-readable instructions executable by a digital data processing apparatus to control an adjustable signal filter to operate as shown herein. Another embodiment concerns logic circuitry having multiple interconnected electrically conductive elements configured to operate an adjustable signal filter to operate as discussed above.

The invention affords its users with a number of distinct advantages. For example, the present invention's signal filter can be initially configured to provide fast acquisition time and then re-configured to provide minimize tracking error. This is possible by operating digital control circuitry to change the filter's analog impedance over time according to feedback, timing, or other desired signals. The adjustable filter of this invention also offers the advantage of low power consumption because it permits dynamic increases in resistance during periods when certain sacrifices in performance are tolerated.

As another advantage, the invention offers an embodiment where all signal paths and their resistors are implemented in an integrated circuit. This conserves valuable integrated circuit "pads," because the individual pads are not needed to separately interface the digital controller with each different signal path's resistor. The invention also provides a number of other advantages and benefits, which should be apparent from the following description of the invention.

DETAILED DESCRIPTION

The nature, objectives, and advantages of the invention will become more apparent to those skilled in the art after considering the following detailed description in connection with the accompanying drawings.

Hardware Components & Interconnections

Introduction

One aspect of the invention concerns a reconfigurable signal filter, which may be embodied by various hardware components and interconnections. One specific example is the signal filter 100 of FIG. 1, which is a passive, first order, R-C type signal filter. The filter 100 includes a resistance assembly 104, digital controller 102, and reactance assembly 106. The resistance assembly 104 is electrically positioned between an input 108 and an output 110. The reactance assembly 136 is electrically positioned between the output 110 and electrical ground 136. Generally, the controller 102 establishes the R-C values of the circuit 100 by selectively adjusting the resistance of the assembly 104 and the reactance of the assembly 106.

Resistance Assembly

Figure 1:
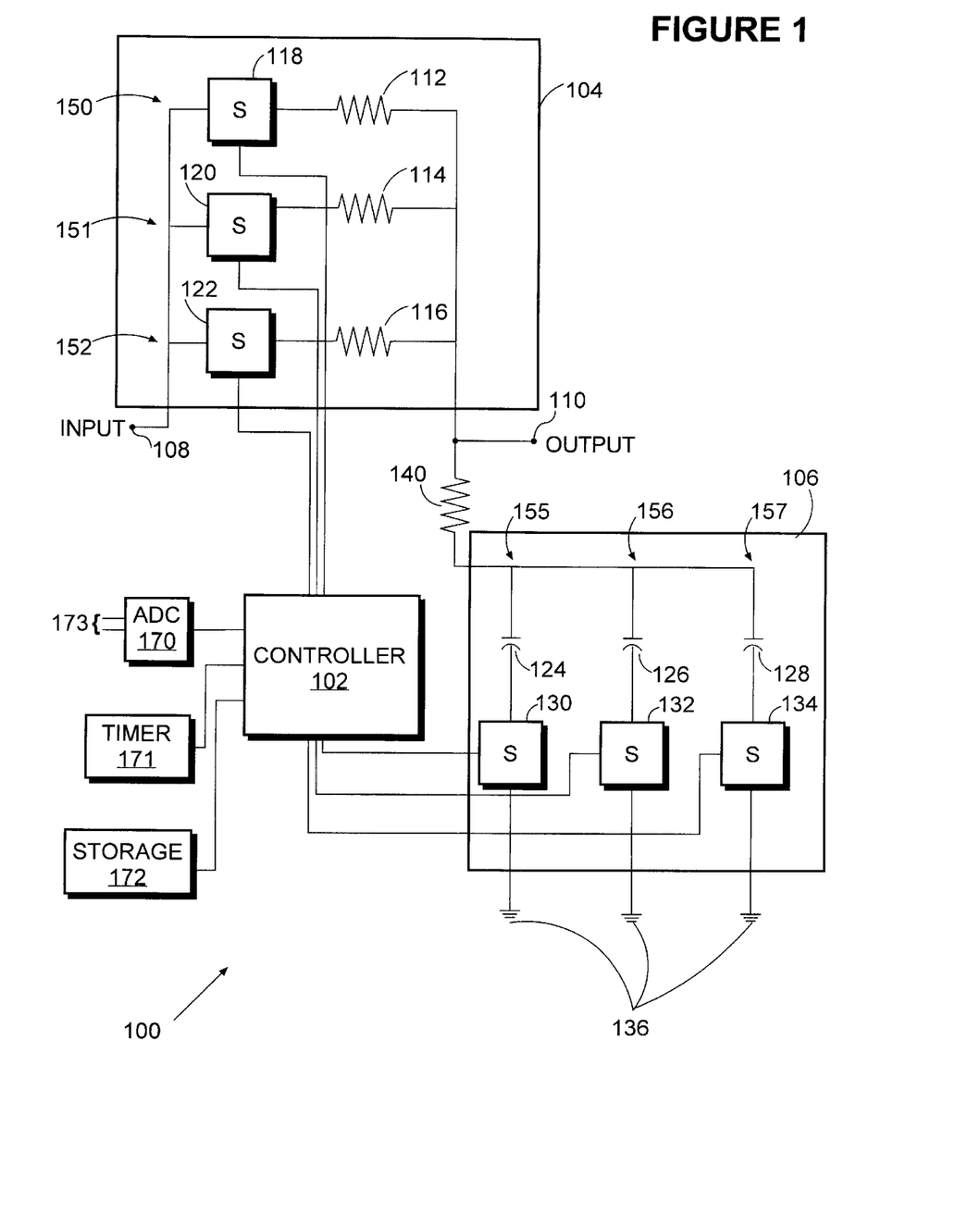
FIG. 1 is a block diagram of the hardware components and interconnections of a reconfigurable signal filter according to the invention.

Considering the circuit 100 in greater detail, the resistance assembly 104 includes multiple parallel signal paths 150–152 that share the common input 108 and common output 110. Each one of the signal paths 150–152 includes a prescribed electrical resistance 112, 114, 116 in series with a corresponding switch 118, 120, 122. The parallel signal paths 150–152 provide a collective resistance between the input 108 and output 110. This collective resistance is equal to the multiplicative product of the resistances of whichever components 112, 114, 116 are activated, this product divided by the sum of the resistance of the activated resistance components.

Each resistance 112, 114, 116 may be implemented in various forms, such as a discrete electrical resistor, "poly" or other electrical resistor provided upon an integrated circuit, wire or signal line with an inherent resistance, etc. Each switch 118, 120, 122 comprises a digitally activated switch serving to electrically activate or disable its path 150–152 depending upon an input signal received from the controller 102. Such a digital switch may comprise a transistor, reed switch, electromagnetic switch, output enable pad of an amplifier/pad, etc. The collective resistance of the assembly 104 includes only those resistance components 112, 114, 116 whose corresponding switch 118, 120, 122 has been activated by the controller 102 at that time. As an example, the digital switches 118, 120, 122 may be implemented by on/off switches provided in digital logic aboard an integrated circuit.

Reactance Assembly

The reactance assembly 106 includes multiple parallel signal paths 155–157 between the output 110 and electrical ground 136. Optionally, a default resistor 140 may be electrically located between the assemblies 104, 106, for the purpose of ensuring that total resistance between input 108 and ground 136 does not fall below a certain minimum. Furthermore, if the resistance components 112, 114, 116 are similar in value, it may be efficient to share a common base value resistance. However, the default resistor 140 may be omitted if desired. Each one of the signal paths 155–157 includes a prescribed electrical reactance 124, 126, 128 and a corresponding switch 130, 132, 134 that is operable to selectively enable or disable the corresponding reactance. The reactance components 124, 126, 128 comprise capacitors (as illustrated) or inductors. Thus, the parallel signal paths 155–157 provide a collective reactance between the output 110 and ground 136. In the case of capacitive reactance elements, this collective reactance is equal to the sum of the capacitance of whichever components 124, 126, 128 have been enabled.

Each reactance element 124, 126, 128 may be implemented in various forms, such as a dielectric capacitor, trench capacitor, inductor, or other suitable reactance element. Each switch 130, 132, 134 comprises a digitally activated switch serving to electrically open or close its signal path 155–157 depending upon an input signal received from the controller 102. The switches 130, 132, 134 may comprise similar components as the switches 118, 120, 122. Thus, the collective reactance of the assembly 106 includes only those reactance components 124, 126, 128 whose corresponding switches 130, 132, 134 has been activated by the controller 102 at that time.

R*C Product

For ease of discussion, the multiplicative product of the collective resistance and the collective reactance is referred to as the "R*C" product of the circuit 100, even though the reactance assembly may be implemented with inductors (L) instead of capacitors (C). As discussed below, adjustments are performed to the resistance and/or capacitance assemblies to change the R*C product, thereby altering the characteristics of the filter 100.

Configuration Input Sources

If desired, the circuit 100 may also include a number of accessory components referred to as configuration input sources. The configuration input sources provide input which used by the controller 102 decide on which switches 118, 120, 122, 130, 132, 134 to activate and when.

One exemplary type of configuration input source is an analog-to-digital converter 170 (ADC). The ADC 170 includes input lines 173 to receive analog signals that are useful in determining how to switch the assemblies 104, 106. For instance, the ADC 170 may receive signals from the input 108 and/or output 110.

Another type of configuration input source is a timer 171. As an example, the controller 102 may reconfigure the assemblies 104, 106 based upon the passage of time, expiration of a counter, etc. Still another type of configuration input source is a data storage 172. As an example, the controller 102 may reconfigure the assemblies 104, 106 in a predetermined order that is provided in a look-up table, file, register, or other data structure in the storage 172. In still another example, the controller 102 may reconfigure the assemblies 104, 106 according to outputs of a digital demodulator or other digital signals such as event indicators, hardware interrupts, and the like.

Controller—Digital Data Processing Apparatus

Figure 3:
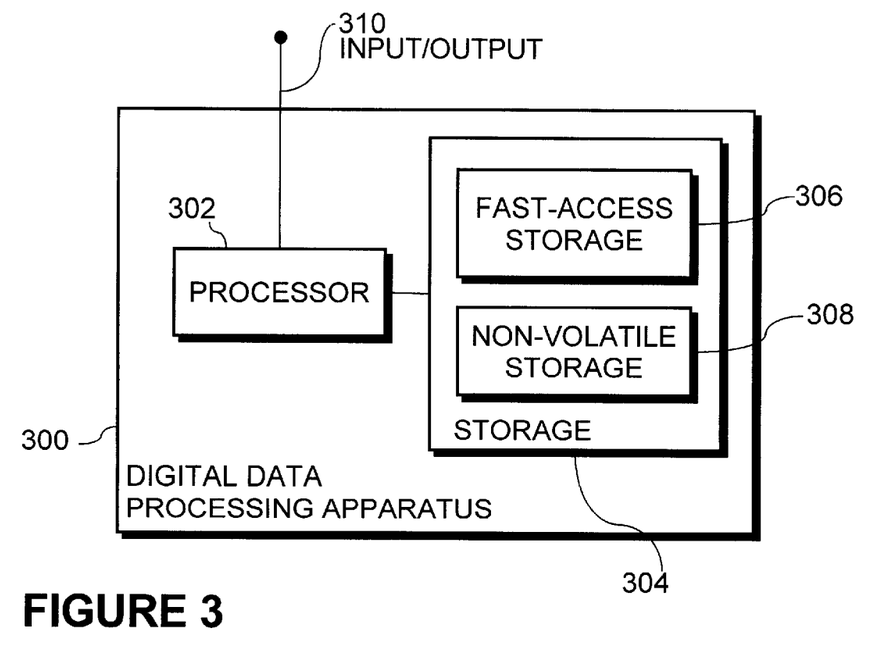
FIG. 3 is a block diagram of a digital data processing machine according to the invention.

Although the controller 102 may be implemented in various forms, one example is a digital data processing apparatus, exemplified by the hardware components and interconnections of the digital data processing apparatus 300 of FIG. 3. The apparatus 300 includes a processor 302, such as a microprocessor or other processing machine, coupled to a storage 304. In the present example, the storage 304 includes a fast-access storage 306, as well as nonvolatile storage 308. The fast-access storage 306 may comprise random access memory ("RAM"), and may be used to store the programming instructions executed by the processor 302. The nonvolatile storage 308 may comprise, for example, one or more magnetic data storage disks such as a "hard drive", a tape drive, read-only memory, or any other suitable storage device. The apparatus 300 also includes an input/output 310, such as a line, bus, cable, electromagnetic link, or other means for the processor 302 to exchange data with other hardware external to the apparatus 300.

Despite the specific foregoing description, ordinarily skilled artisans (having the benefit of this disclosure) will recognize that the apparatus discussed above may be implemented in a machine of different construction, without departing from the scope of the invention. As a specific example, one of the components 306, 308 may be eliminated; furthermore, the storage 304 may be provided on-board the processor 302, or even provided externally to the apparatus 300.

Controller—Logic Circuitry

In contrast to the foregoing digital data processing apparatus, a different embodiment of the invention uses logic circuitry instead of computer-executed instructions to implement the controller. Depending upon the particular requirements of the application in the areas of speed, expense, tooling costs, and the like, this logic may be implemented by constructing an application-specific integrated circuit ("ASIC") having thousands of tiny integrated transistors. Other alternatives include a digital signal processing chip ("DSP"), discrete circuitry (such as resistors, capacitors, diodes, inductors, and transistors), field programmable gate array ("FPGA"), programmable logic array ("PLA"), and the like.

Second Example

Figure 2:
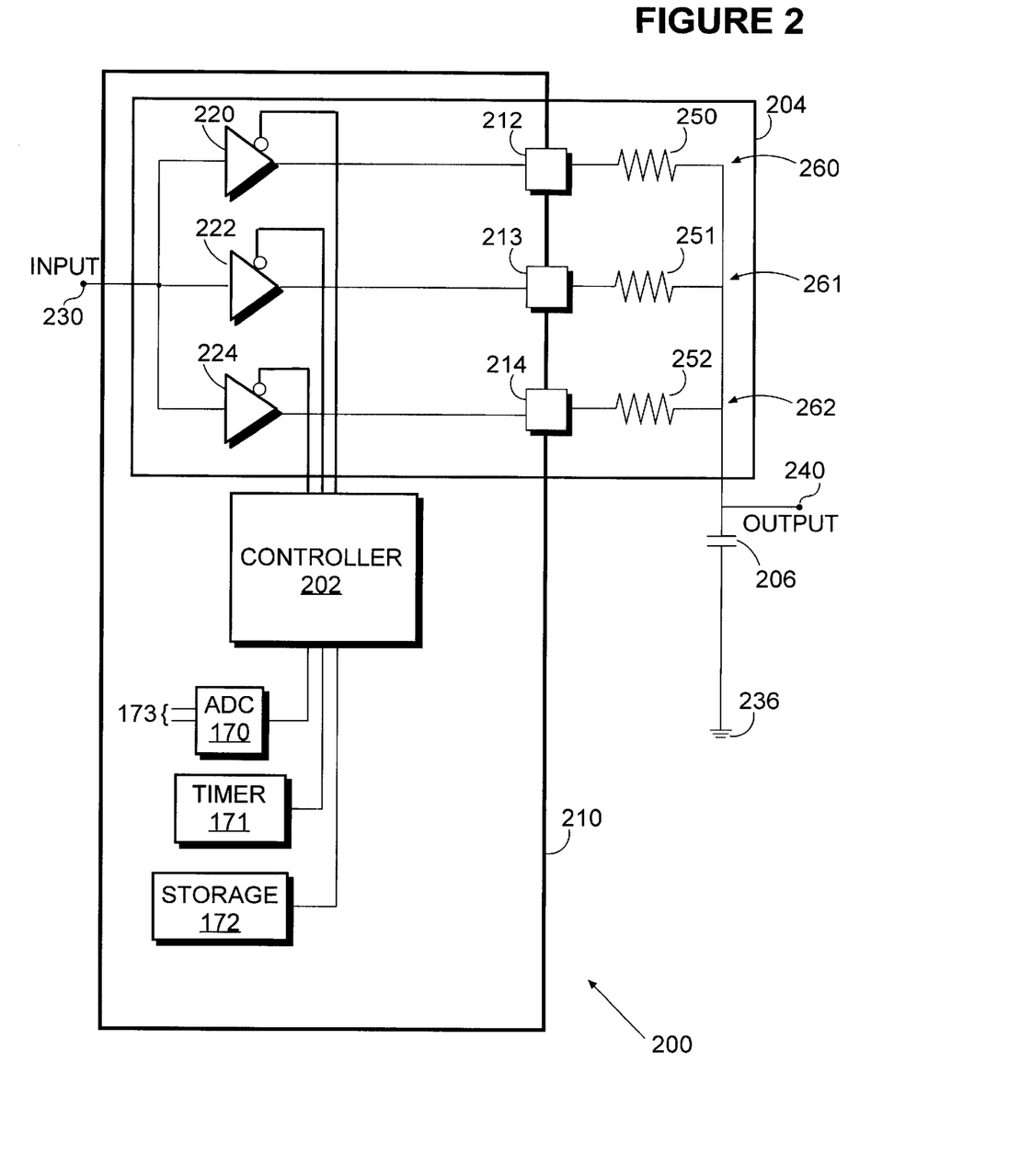
FIG. 2 is a block diagram of the hardware components and interconnections of a reconfigurable signal filter according to the invention, partially implemented in an integrated circuit.

Having described one example of this invention's configurable signal filter in FIG. 1, reference is made to FIG. 2 to address a more specific implementation. Namely, FIG. 2 depicts a passive, first order, R-C filter 200 where the resistance assembly is implemented with discrete resistors and integrated switches, the reactance assembly includes a single dielectric capacitor, and various components are implemented aboard an integrated circuit.

More particularly, the filter 200 includes a resistance assembly 204, digital controller 102, and a reactance assembly 206. For ease of illustration, the reactance assembly is shown as a single capacitor, although multiple capacitors (as with the assembly 106, FIG. 1) are also contemplated. The resistance assembly 204 is electrically positioned between an input 230 and an output 240. The capacitor 240 is connected to electrical ground 236. Although the capacitance of the element 206 is fixed in this implementation, the controller 202 may establish the R-C value of the filter 200 by selectively activating one or more resistors 250–252.

Considering the circuit 200 in greater detail, the resistance assembly 204 includes multiple parallel signal paths 260–262 that share the common input 230 and common output 240. Each one of the signal paths 260–262 includes a resistor 250–252 in series with a switch 220, 222, 224. The resistors 250–252 are provided by discrete circuit elements, whereas the switches 220, 222, 224 are implemented in an integrated circuit 210. Connection pads 212, 213, 214 of the integrated circuit 210 provide a coupling point between the discrete, analog resistors 250–252 and the digital switches 220, 222, 224. As with the circuit 100 (FIG. 1), the parallel signal paths 260–262 provide a collective resistance between the input 230 and output 240.

The filter 200 utilizes a reactance assembly having a single member, embodied by the capacitor 206.

The controller 202 may be implemented in similar fashion as the controller 102, discussed above. As shown, the controller 202 is implemented upon the integrated circuit 210. Even though the controller 202 and switches 220, 222, 224 are implemented in digital logic, the manner of their electrical connection to the resistors 250–252 permits digital circuitry to control the analog characteristics of the filter 200.

If desired, the circuit 210 may also include an ADC 170, timer 171, storage 172, digital demodulator, or other components connected to the controller 202, for similar purposes as discussed above in the context of the circuit 100 (FIG. 1). Furthermore, it is reemphasized that the single capacitor 206 may alternatively be implemented by a single inductor, or by a reactance assembly of multiple capacitors or inductors and associated switches similar in situs, connection, and operation as the switches 220, 222, 224.

Operation

Having described the structural features of the present invention, the method aspect of the present invention will now be described. Although the present invention has broad applicability to signal filters, the specifics of the structure that has been described is aptly suited for passive, first order, R-C type filters, and the explanation that follows will emphasize such an application of the invention without any intended limitation.

Signal—Bearing Media

In the context of FIGS. 1–3, such a method may be implemented, for example, by operating the controller 102 or 202, as embodied by a digital data processing apparatus 300, to execute a sequence of machine-readable instructions.

These instructions may reside in various types of signal-bearing media. In this respect, one aspect of the present invention concerns a programmed product, comprising signal-bearing media tangibly embodying a program of machine-readable instructions executable by a digital data processor to perform a method to operate a signal filter in which analog impedance values are digitally controlled.

Figure 4:
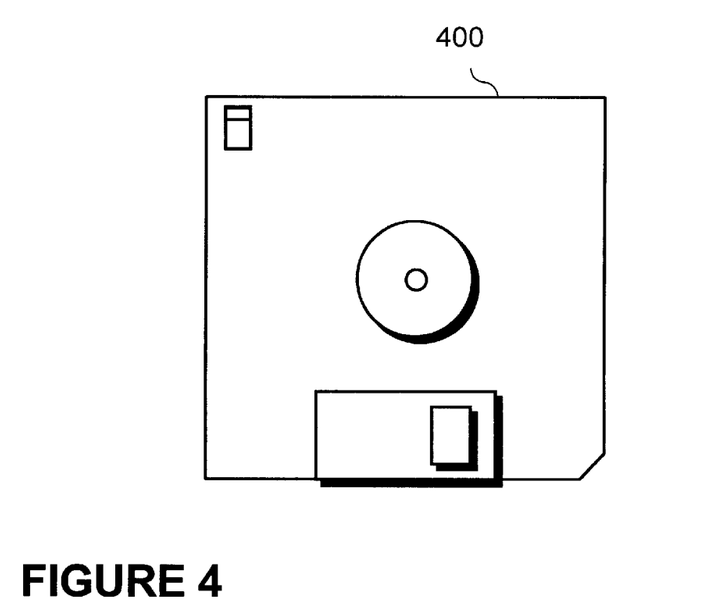
FIG. 4 shows an exemplary signal-bearing medium according to the invention.

This signal-bearing media may comprise, for example, RAM (not shown) contained within the controller 102 or 202, as represented by the fast-access storage 306. Alternatively, the instructions may be contained in another signal-bearing media, such as a read only memory accessible by the controller 102 or 202, or by a magnetic data storage diskette 400 (FIG. 4), directly or indirectly accessible by the processor 202. Whether contained in the storage 306, diskette 400, or elsewhere, the instructions may be stored on a variety of machine-readable data storage media, such as direct access storage (e.g., a conventional "hard drive", redundant array of inexpensive disks ("RAID"), or another direct access storage device ("DASD")), magnetic tape, electronic read-only memory (e.g., ROM, EPROM, or EEPROM), optical storage (e.g., CD-ROM, WORM, DVD, digital optical tape), paper "punch" cards, or other suitable signal-bearing media including transmission media such as digital and analog and communication links and wireless. In an illustrative embodiment of the invention, the machine-readable instructions may comprise software object code, compiled from a language such as "C," etc.

Logic Circuitry

In contrast to the signal-bearing medium discussed above, the method aspect of the invention may be implemented using logic circuitry, without using a processor or controller to execute instructions. In this embodiment, the logic circuitry is implemented as part of the controller, and is configured to perform operations to implement the method of the invention. The logic circuitry may be implemented using many different types of circuitry, as discussed above.

Operating Sequences

Figure 5:
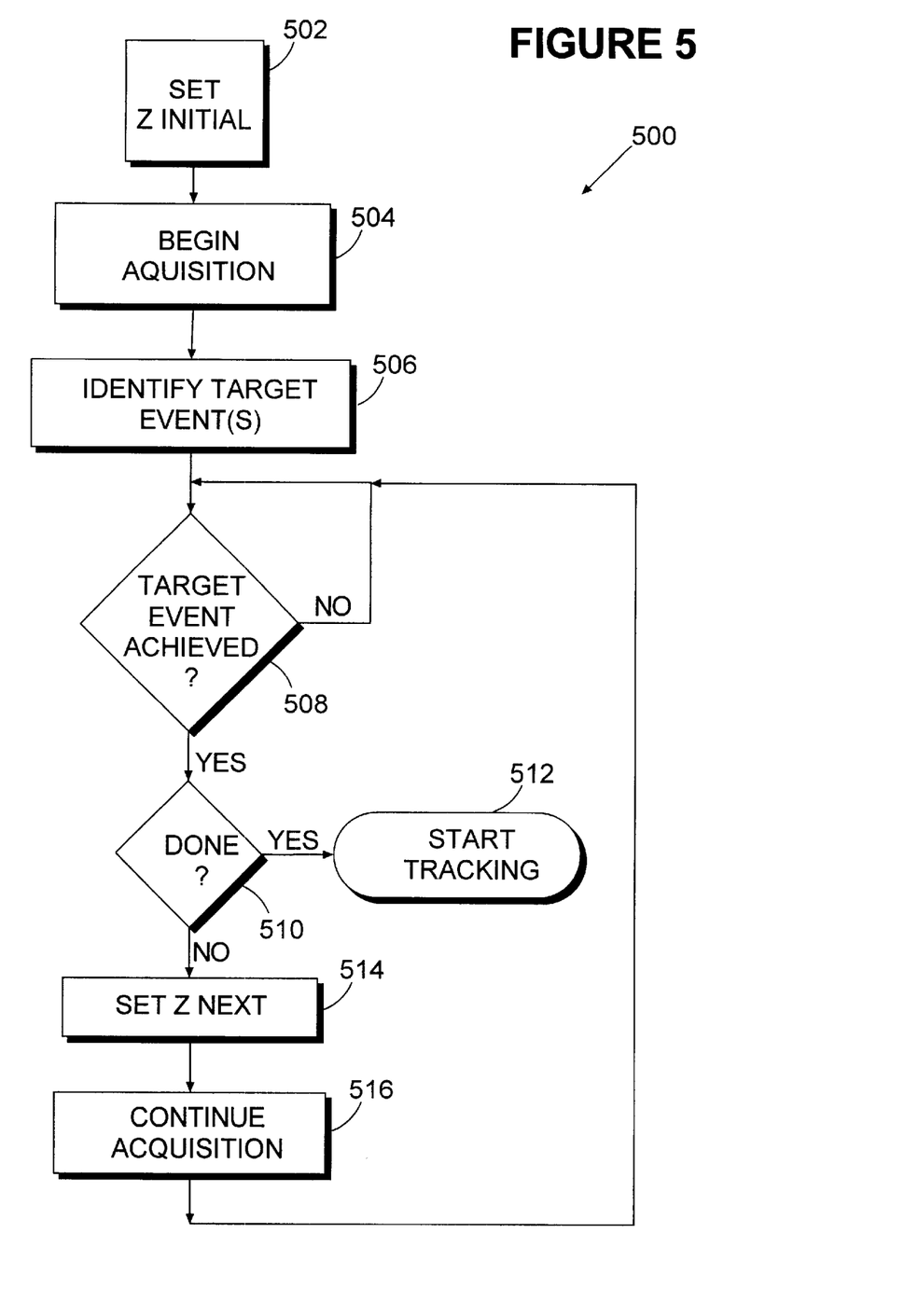
FIG. 5 is a flowchart of an acquisition sequence utilizing a signal filter with selectively configured impedance elements, according to the invention.
Figure 6:
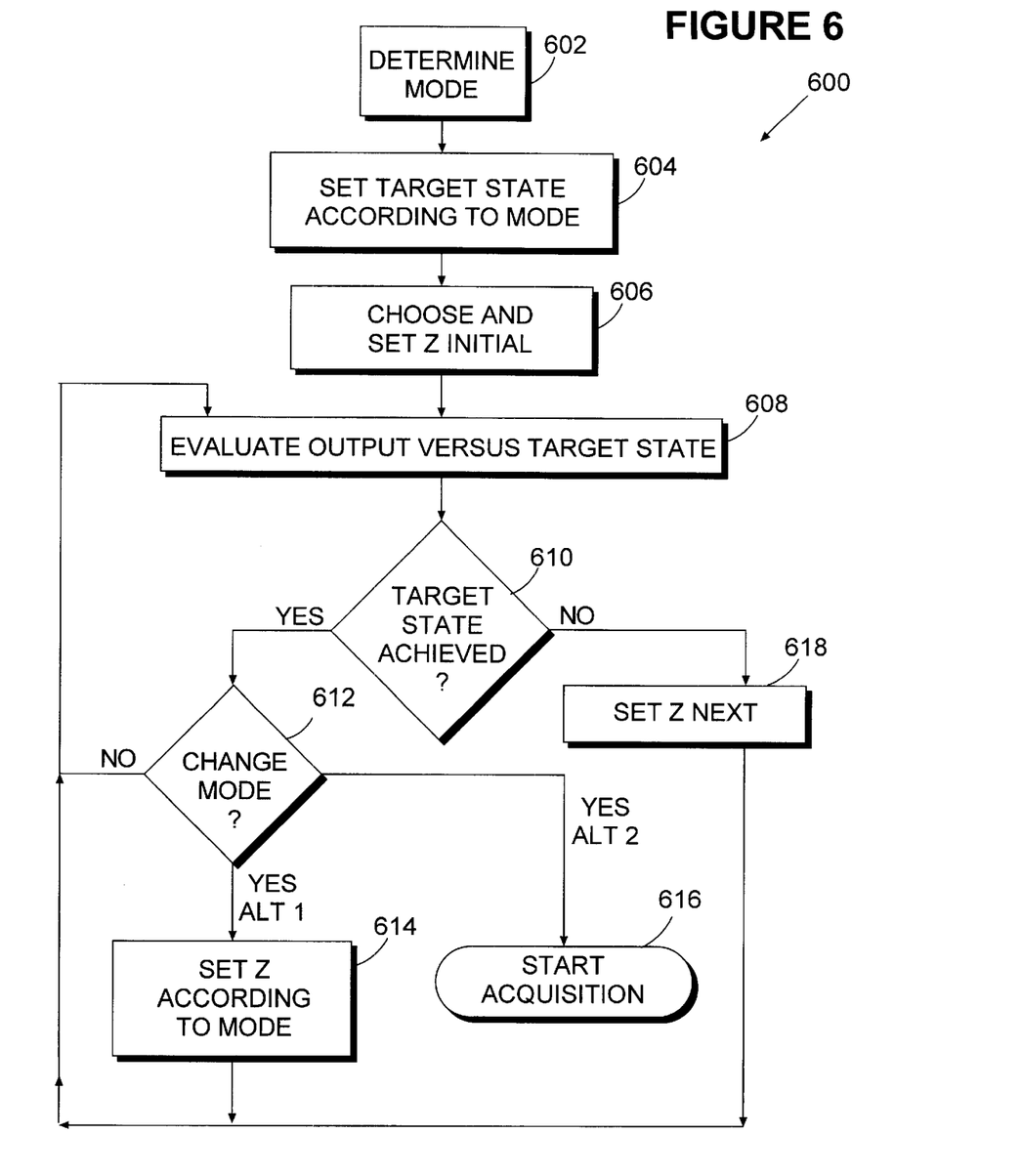
FIG. 6 is a flowchart of a tracking sequence utilizing a signal filter with selectively configured impedance elements, according to the invention

FIGS. 5–6 depict acquisition and tracking operating sequences to exemplify the method aspect of the invention. The sequence 500 describes the process of establishing and adjusting impedance of an analog signal filter in order to "acquire" an input signal. The sequence 600 describes the process of adjusting impedance of the analog signal filter to "track" the input signal. Accordingly, both acquisition and tracking modes are discussed, although the invention also contemplates a variety of further operational modes made possible by the reconfigurable nature of the illustrated filters. For ease of explanation, but without any intended limitation, the examples of FIGS. 5–6 are described in the context of the filter 100 described above (FIG. 1).

Acquisition Sequence

As mentioned above, the sequence 500 describes a process of automatically establishing and adjusting the resistance and capacitance of the filter 100 in order to "acquire" an input signal. Generally, when a given signal is input to the filter 100 (at 108), the filter aims to provide a specific, "target" output signal (at 110) whose amplitude is dictated by the values and interconnections of the filter's circuit components. Signal "acquisition" time refers to the time in which the filter achieves this target output signal within some tolerance.

The signal acquisition sequence 500 begins in step 502, where the controller 102 establishes initial values of resistance (in the assembly 104) and capacitance (in the assembly 106). These values are established by activating the appropriate switches 118, 120, 122 (for resistance) and the appropriate switches 130, 132, 134 (for capacitance). The impedance initially established in step 502 may, for example, including a relatively low resistance and a relatively low capacitance, and hence low R*C product, in order to ensure quick acquisition.

After step 502, an input signal is received at the input 108, and with the filter 100 configured per step 502, the filter 100 begins acquiring the input signal in step 504. Namely, the filter's analog components (as activated in step 502) start to provide a steady-state output signal appropriate to the current input signal.

In step 506, the controller 102 identifies one or more "target events." The target events identify states, times, signal values, or other predetermined criteria that signify times to change the R*C product of the filter 100 in order to meet predetermined goals of speed, accuracy, reduced power consumption, or other acquisition characteristics. As an example, the target events may include times or counter values (from the timer 171), certain signal values (from the ADC 170) such as input or output signal values, or other criteria.

The controller 102 may identify the target events (step 506), for example, by recalling event criteria from a site such as the storage 172. In this arrangement, changing the contents of the storage 172 can be used to reprogram the controller 102 for recognition of different target events.

After the target events are identified in step 506, the controller 102 determines whether the next target event has occurred (step 508). When the next target event occurs, step 508 advances to step 510, where the controller 102 determines whether acquisition is done. Acquisition may be scheduled to end at a prescribed time, after a prescribed number of events, when the output signal (at 110) reaches a prescribed value, or any other occurrence or state. Conditions for the end of acquisition may be contained, for example, in the storage 172 or other programming of the controller 102. As one specific example, acquisitions may be deemed complete when the output signal at 110 reaches a certain voltage.

If acquisition is not done, the controller 102 adjusts the values of resistance (in the assembly 104) and capacitance (in the assembly 106), as shown by step 514. These values are adjusted by activating the appropriate switches 118, 120, 122 (for resistance) and the appropriate switches 130, 132, 134 (for capacitance). The impedance adjustment of step 514, for example, may seek to increase the filter's R*C product in order to reduce tracking error while sacrificing some acquisition or tracking speed. Additionally, in step 514 the controller 102 may also adjust the update rate of the controller's clock frequency.

After each adjustment step 514, the filter 100 continues acquisition (step 516). Namely, with the filter 100 reconfigured per step 514, the filter 100 provides an output signal (at 110) appropriate to the input signal (at 108) and newly established resistance/reactance values. After step 516, the controller 102 returns to step 508 to determine whether the next target event has occurred.

In contrast with the foregoing events, if the controller 102 determines that the prescribed acquisition has completed (step 510), then the controller 102 advances to step 512, which begins the tracking sequence 600 (FIGURE) as described below.

Tracking Sequence

In contrast to acquisition, which seeks to quickly establish a steady-state signal appropriate to the signal 108, tracking seeks to minimize the ongoing error between the filter's actual output signal and the target (or "steady-state") signal. The tracking sequence 600 begins in step 602, which is initiated by step 512 of FIG. 5 as discussed above. In step 602, the controller 102 determines which operating mode is desired for tracking. The filter's operating mode refers to the configuration of the assemblies 104, 106 to yield a desired resistance and reactance, and any other control parameters (such as controller clock speed) that affect performance. The controller 102 may identify the operating mode (step 602), for example, by recalling stored instructions from a site such as the storage 172. In this arrangement, changing the contents of the storage 172 can be used to reprogram the controller 102 to utilize certain operating modes at different times or conditions. In the present example, the operating modes include the following:

1. Low Power Mode, where a greater R*C product and/or slower clock speed are used to reduce power, in cases where increased signal tracking error is tolerated.
2. Mid-Power Mode, a slightly smaller R*C product and/or slightly faster clock speed are utilized, permitting less signal tracking error in order to achieve greater tracking accuracy while still conserving power.
3. Fast-Tracking Mode, where an even smaller R*C product and/or even faster clock speed are utilized, further increasing signal tracking accuracy and response with less concern for power utilization.

Although these three representative operating modes have been discussed, ordinarily skilled artisans (having the benefit of this disclosure) will recognize that this invention contemplates a limitless number of intermediate modes using different filter configurations.

In step 604, the controller selects a "target state" according to the operating mode. In the present example, utilizing the operating modes discussed above, the target state refers to an error between the output signal (at 110) and the "target" or "steady state" output signal that is appropriate to the input signal (at 108). For example, in the low power mode, the target state may specify a certain percentage range of error between actual and target (steady-state) output signals. Further, the mid-power and fast-tracking modes may specify less and lesser (respectively) error between actual and target output signals.

Following step 604, the controller 102 in step 606 establishes initial values of resistance (in the assembly 104) and capacitance (in the assembly 106). These values are established by activating the appropriate switches 118, 120, 122 (for resistance), the appropriate switches 130, 132, 134 (for capacitance) according to the mode determined in step 602. Step 606 may further adjust the clock rate of the controller 102. The impedance initially established in step 606 may, for example, include a higher resistance than used in acquisition in order to minimize tracking error and thereby lessen the susceptibility to noise.

After step 606, the controller 102 in step 608 evaluates the signal at the output 110 (actual output) in regard to the output signal, to determine whether the target state of step 604 has been met. If the target state is not satisfied, then step 610 advances to step 618, where the controller 102 establishes a new collective resistance, and/or clock rate collective reactance, for the filter 100. After step 618, control returns to step 608, where the controller 102 reevaluates the filter's output.

On the other hand, if the controller 102 finds that the target state has been achieved (step 610), then the controller 102 asks whether achievement of this target state requires a change in operating mode (step 612). Changes in the operating mode may occur for various reasons. If the filter 100 is implemented in a consumer device, the operating mode may change by user input at this time. Alternatively, the operating mode may change automatically in response to low battery charge, loss of plug-in power and consumption of battery power, expiration of a prescribed time, or another reason such as an occurrence identified in the storage 172 or other programming of the controller 102. If there is no required mode change, step 612 returns to step 608, where the controller 102 reevaluates the filter's output.

On the other hand, if step 612 requires a change in operating mode, then the controller 102 reconfigures the filter 100 to utilize the specified operating mode. This may be achieved in various ways, two alternative examples of which are shown in steps 614 and 616. In step 614, the controller 102 begins the new operating mode by establishing a new value of resistance (in the assembly 104) and/or capacitance (in the assembly 106) appropriate to the new operating mode. These values are established by activating the appropriate switches 118, 120, 122 (for resistance) and the appropriate switches 130, 132, 134 (for capacitance). The controller clock update rate may also be changed. After step 614, the controller 102 returns to step 608 to reevaluate the filter's output. As an alternative to step 614, the controller 102 may institute an operating mode change by commencing acquisition (step 616). For example, a universally applicable acquisition sequence (such as 500) may be performed, followed by commencement of tracking in the desired operating mode. As a different example, an acquisition sequence with resistance/reactance values particularly suited to the new operating mode may be initiated, followed by tracking in that operating mode.

Discussion of Example

Figure 7:
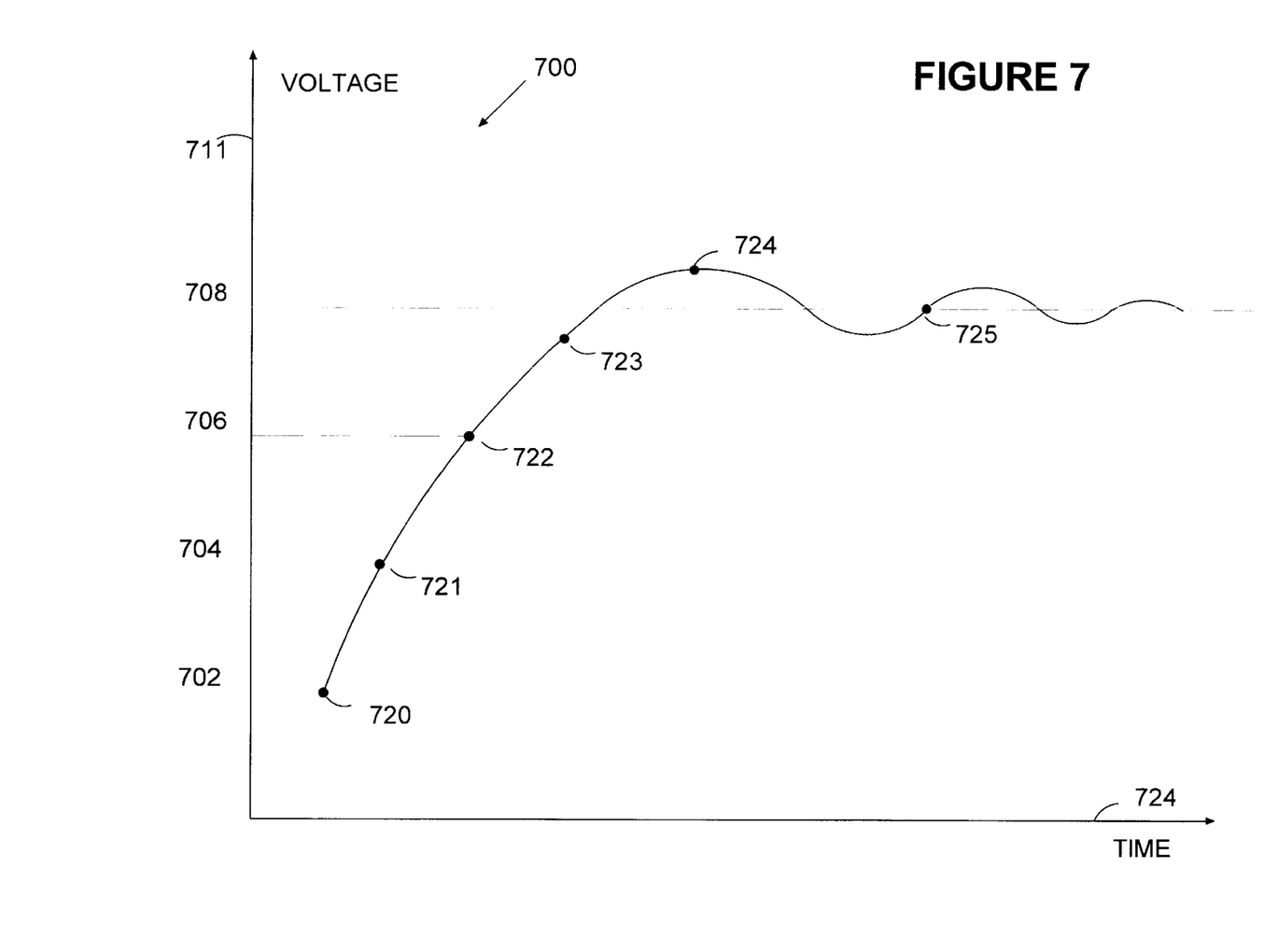
FIG. 7 is a signal diagram illustrating the magnitude of a filter output signal over time, as influenced by reconfiguration of impedance elements according to the invention.

To further illustrate the operation of the present invention, a more detailed example is illustrated with reference to FIG. 7, which shows an output signal produced by the filter 100 (at 110) during a finite time period. In the diagram of FIG. 7, the horizontal axis 724 represents time and the vertical axis 711 represents voltage at the output 110. During the illustrated time period, the input signal comprises a constant voltage level (not shown), for which the steady-state "target" output voltage of the filter 100 is the voltage 708.

Referring to FIG. 5, the acquisition sequence begins in step 502, where the controller 102 establishes initial values of resistance (in the assembly 104) and capacitance (in the assembly 106). The impedance initially established in step 502 may, for example, including a relatively low R*C product in order to ensure quick acquisition. Accordingly, the appropriate ones of switches 118, 120, 122 are closed to yield an appropriate resistance in the assembly 104. Alternatively, or in addition, appropriate ones of the switches 124, 126, 128 are closed to yield an appropriate capacitance in the assembly 106 to yield the desired R*C product.

After step 502, the input signal (not shown) is received at the input 108, and with the filter 100 configured per step 502, the filter 100 begins acquiring the input signal in step 504. Namely, the filter's analog components (activated in step 502) start towards providing a steady-state output signal appropriate to the current input signal. As of step 504, the filter's actual output signal at 110 is represented by 720 (FIG. 7).

In step 506, the controller 102 identifies various target events, which in this case include the expiration of three successive one-millisecond periods after step 504. These target events are contained in the storage 172 for reference by the controller 102. In step 508, the controller 102 waits until the first one-millisecond period expires according to the timer 171. When his occurs, the filter's output signal is represented by 721 (FIG. 7). In step 510, the controller 102 determines whether acquisition is done. In the present example, acquisition is not complete yet because only a single one-millisecond period has expired, and three must expire to complete acquisition. Therefore, step 510 advances to step 514.

In step 514, the controller 102 adjusts the values of resistance (in the assembly 104) and capacitance (in the assembly 106). These values are adjusted by activating the appropriate switches 118, 120, 122 (for resistance) and the appropriate switches 130, 132, 134 (for capacitance). The impedance adjustment of step 514, for example, may seek to increase the R*C product. Although the filter may be initially configured for fast signal response, this type of adjustment is used to incrementally reduce the filter's response speed in order to successively reduce tracking error.

After each adjustment of the filter's resistance/reactance (step 514), the filter 100 continues acquisition (step 516). Namely, with the filter 100 reconfigured per step 514, the filter 100 continues to process the input signal present at 108, now providing an output signal (at 110) that results from the newly adjusted resistance/reactance values. The filter's output at the completion of three successive one-millisecond periods is shown at 721, 722, 723, respectively. One result of the successive impedance adjustments may be a change in slope of the curve 700, as shown between output levels 722–723 relative to the slope between output levels 720–721.

When all three of the one-millisecond period have expired, the output signal at 110 is shown by 723. At this time, step 510 ends acquisition by commencing tracking (step 512).

In tracking, the controller 102 first determines operating mode (step 602). In this example, the filter 100 is implemented in a consumer electronics device and the operating mode is user selected. The controller 102 may determine the operating mode by recalling a value in storage 172, querying an operating mode module, consulting a state machine, or any other suitable technique. In the present example, the user (not shown) has selected the "Low Power Mode" as the filter's initial operating mode. This operating mode tolerates more error between actual and target output signals, but conserves power.

In step 604, the controller selects a "target state" according to the operating mode. In the present example, with Low Power Mode being selected, the target state refers to a prescribed error between the output signal (at 110) and the steady state (target) output signal 708 that is appropriate to the input signal (at 108). After step 604, the controller 102 in step 606 establishes initial values of resistance (in the assembly 104) and capacitance (in the assembly 106) appropriate to the Low Power Mode of operation. These values are established by activating the appropriate switches 118, 120, 122, 130, 132, 134 to select a sufficiently high R*C product to provide the desired Low Power Mode.

After step 606, the controller 102 evaluates the signal at the output 110 in regard to the target state that was set in step 604. If this evaluation is conducted when the output signal is at the state 724, step 610 concludes that the target state (error) has not been achieved because there is a substantial difference (in this example) between the actual output voltage 724 and the target, steady-state level of voltage 708. In this case, the controller 102 then establishes a new collective resistance and/or collective reactance for the filter 100 (step 618). As an example, the filter's impedance may be incrementally adjusted (step 618) until the target state is reached (step 610), as shown by the output signal state 725 (FIG. 7).

When the output signal at 110 satisfies the target state, step 612 checks for an operating mode change. Changes in operating mode may result in impedance adjustments (step 614) or reacquisition (step 616), as discussed above.

Other Embodiments

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated. Additionally, ordinarily skilled artisans will recognize that operational sequences must be set forth in some specific order for the purpose of explanation and claiming, but the present invention contemplates various changes beyond such specific order.

What is claimed is:

1. A configurable signal filter apparatus, comprising:
   a resistance assembly of multiple parallel signal paths between an input and an output, each signal path including a prescribed electrical resistance and a corresponding switch to selectively enable and disable the resistance, the signal paths providing a collective resistance between the input and the output;
   a reactance assembly including at least one electrical reactance coupled between the output and electrical ground;
   an analog-to-digital converter having an input port coupled to the output of the resistance assembly and an output port coupled to an digital controller; and
   the digital controller, configured to adjust the collective resistance by selectively operating the switches.

2. The apparatus of claim 1, the controller configured to adjust the collective resistance responsive to at least one of the following:
   signals received from the analog-to-digital converter, a timer signal.

3. The apparatus of claim 1, the reactance assembly comprising:
   multiple parallel signal paths electrically connected between the output and electrical ground, each said signal path including an electrical reactance and a corresponding switch to selectively enable and disable the reactance.

4. The apparatus of claim 3, the switches comprising transistors.

5. The apparatus of claim 1, wherein the digital controller, the analog-to-digital converter and the switches are located inside of an integrated circuit, and the integrated circuit includes a plurality of pads, and each of the prescribed electrical resistances of the resistance assembly is connected to one of the plurality of pads.

6. The apparatus of claim 1, the switches comprising transistors.

7. The apparatus of claim 1, each said electrical resistance comprising one or more resistors.

8. The apparatus of claim 1, each said electrical reactance comprising one or more capacitors.

9. The apparatus of claim 1, where:

the reactance assembly comprises multiple parallel signal paths coupled between the output and electrical ground, each signal path in the reactance assembly including an electrical reactance and a switch to selectively enable and disable the reactance, the signal paths of the reactance assembly providing a collective reactance between the output and electrical ground;

the digital controller is further configured to adjust the collective reactance by selectively activating the switches of the reactance assembly.

10. The apparatus of claim 9, the controller configured to adjust the collective reactance responsive to at least one of the following:

signals received from the analog-to-digital converter, a timer signal.

11. The apparatus of claim 1, where the switches are provided upon an integrated circuit.

12. The apparatus of claim 1, further comprising an additional resistance coupled between the output and the reactance assembly.

13. A configurable signal filter apparatus, comprising:

a resistance assembly including at least one electrical resistance coupled between an input and an output;

a reactance assembly of multiple parallel signal paths coupled between the output and electrical ground, each signal path including a prescribed electrical reactance and a switch to selectively enable and disable the reactance, the signal paths providing a collective reactance between the output and electrical ground;

a digital controller configured to adjust the collective reactance by selectively operating the switches; and an analog-to-digital converter having an input port coupled to the output and an output port coupled to the digital controller.

14. A signal filter with adjustable filter parameters, comprising:

a passive signal filter including an adjustable resistance and a reactance, and having input and output nodes;

an analog-to-digital converter coupled to the output node;

a digit controller coupled to the adjustable resistance, and programmed to perform operations to adjust the resistance and to manage the performance of the filter; and the analog-to-digital converter (ADC) coupled to the digital controller, and in response to signals provided by the ADC the digital controller reconfiguring the filter circuit by adjusting the resistance.

15. The filter of claim 14, the reactance being an adjustable reactance, the controller being coupled to the adjustable reactance and being further responsive to each target event to adjust the reactance.

16. The filter of claim 14, where the controller is programmed such that the target events include expiration of a timer.

17. The filter of claim 14, where the controller is programmed such that the target events include presence of a signal at the output node having a magnitude within a prescribed tolerance of a target output of the filter.

18. A configurable R-C filter, comprising:

resistance assembly means for providing a collective resistance between an input and an output nodes where a value of the collective resistance changes responsive to switching signals;

a reactance assembly means for providing a collective reactance between the output node and electrical ground;

controller means, coupled to the resistance assembly means, for providing the switching signals to adjust the collective resistance; and an analog-to-digital converter means having an input coupled to the output node and an output coupled to the controller means.

19. The filter of claim 18, the reactance assembly means being responsive to switching signals to change a value of the collective reactance, the controller means additionally providing switching signals to adjust the collective reactance.

* * * * *